United States Patent
Shen et al.

(10) Patent No.: US 10,341,048 B2
(45) Date of Patent: Jul. 2, 2019

(54) CHANNEL ENCODING AND DECODING METHOD AND APPARATUS

(71) Applicant: HUAWEI TECHNOLOGIES CO., LTD., Shenzhen, Guangdong (CN)

(72) Inventors: Hui Shen, Shenzhen (CN); Bin Li, Shenzhen (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days.

(21) Appl. No.: 14/865,811

(22) Filed: Sep. 25, 2015

(65) Prior Publication Data

US 2016/0013887 A1 Jan. 14, 2016

Related U.S. Application Data

(63) Continuation of application No. PCT/CN2014/074201, filed on Mar. 27, 2014.

(30) Foreign Application Priority Data

Mar. 27, 2013 (CN) .......................... 2013 1 0102529

(51) Int. Cl.
*H04L 1/00* (2006.01)
*H03M 13/13* (2006.01)

(52) U.S. Cl.
CPC .......... *H04L 1/0041* (2013.01); *H04L 1/0045* (2013.01); *H04L 1/0057* (2013.01); *H03M 13/13* (2013.01); *H04L 1/0058* (2013.01)

(58) Field of Classification Search
CPC .... H03M 13/13; H04L 1/0041; H04L 1/0058; H04L 1/0057

(Continued)

(56) References Cited

U.S. PATENT DOCUMENTS 8,347,186 B1 1/2013 Arikan
9,304,859 B2 * 4/2016 Aliev .................... G06F 11/108
(Continued)

FOREIGN PATENT DOCUMENTS

CN 101809958 A 8/2010
CN 102122983 A 7/2011
(Continued)

OTHER PUBLICATIONS

Junxuan Wang et al., "Polar code and its characters", Modem Electronics Technique 35(1):65-7, Jan. 2012, with partial translation, total 6 pages.

(Continued)

*Primary Examiner* — Leila Malek
(74) *Attorney, Agent, or Firm* — Fish & Richardson P.C.

(57) ABSTRACT

Embodiments of the present invention provide a channel encoding and decoding method and apparatus, where a channel encoding method includes: acquiring, by an encoder, an information bit index set; generating, by the encoder, a second bit vector according to a to-be-encoded first information bit and the information bit index set; and performing, by the encoder, Polar code encoding on the second bit vector to generate an encoded first code word. In technical solutions of the present invention, an encoder first acquires an information bit index set, generates a second bit vector according to a to-be-encoded first information bit and the information bit index set, and then performs Polar code encoding on the second bit vector to generate an encoded first code word.

18 Claims, 10 Drawing Sheets

(58) Field of Classification Search
USPC .......................................................... 375/295
See application file for complete search history.

(56) References Cited

U.S. PATENT DOCUMENTS

| | | |
|---|---|---|
| 2005/0204255 A1 | 9/2005 | Yeh et al. |
| 2009/0217139 A1 | 8/2009 | Roh et al. |
| 2009/0297144 A1 | 12/2009 | Djordevic et al. |
| 2013/0058425 A1 | 3/2013 | Zhou et al. |
| 2013/0117344 A1* | 5/2013 | Gross .................... G06F 17/10 708/490 |

FOREIGN PATENT DOCUMENTS

| | | |
|---|---|---|
| CN | 102164025 A | 8/2011 |
| CN | 102237973 A | 11/2011 |
| CN | 104079370 A | 10/2014 |

OTHER PUBLICATIONS

Bin Li et al., "Theory and Application of Polar Code", Communications Technology 10, 2012, with partial translation, total 6 pages.
Viveck R. Cadambe et al., "Interference Alignment and Spatial Degrees of Freedom for the K User Interference Channel", ICC, 2008, total 5 pages.
Erdal Arikan, "Channel Polarization: A Method for Constructing Capacity-Achieving Codes for Symmetric Binary-Input Memoryless Channels", IEEE Transactions on Information Theory 55(7):3051-73 (Jul. 2009).
Ido Tal et al., "List Decoding of Polar Codes", 2011 IEEE Intl. Symposium on Information Theory Proceedings, total 5 pages (2011).
Hesami, Peyman, "Channel Polarization and Polar Codes; Capacity Achieving," Tutorial of Information Theory Course, University of Notre Dame, Dec. 9, 2009. total 9 pages.

\* cited by examiner

CHANNEL ENCODING AND DECODING METHOD AND APPARATUS

CROSS REFERENCE

This application is a continuation of International Application No. PCT/CN2014/074201, filed on Mar. 27, 2014, which claims the priority of Chinese Patent Application No. 201310102529.X, filed on Mar. 27, 2013, both of which are hereby incorporated by reference in their entities.

TECHNICAL FIELD

Embodiments of the present invention relate to communications technologies, and in particular, to a channel encoding and decoding method and apparatus.

BACKGROUND

In a communications system, an encoding technology is generally used to improve reliability of data transmission and ensure quality of communication. A polar code (Polar code) is a first encoding and decoding algorithm that is theoretically proved to be capable of obtaining a Shannon capacity and has low encoding and decoding complexity (complexity of encoding and complexity of decoding are both O(NlogN)).

The polar code is a linear block code. An encoded code word of an original Polar code does not include an information bit, and the original Polar code is a non-system code. Because some communications technologies need to use a system code to perform encoding and decoding, application of the original Polar code in some communications technologies is limited.

In the prior art, a Gaussian elimination based method (Gaussian elimination based method) is used to transform the Polar code into the system code. However, after the Polar code is transformed into the system code in the prior art, complexity of the Polar code increases to $O(N^3)$, that is, the complexity of the Polar code is increased.

SUMMARY

Embodiments of the present invention provide a channel encoding and decoding method and apparatus, which can implement that a Polar code is converted into a system code in a manner with relatively low complexity, and can improve bit error rate performance of the Polar code.

According to a first aspect of the present invention, a channel encoding method is provided, including:
  acquiring, by an encoder, an information bit index set;
  generating, by the encoder, a second bit vector according to a to-be-encoded first information bit and the information bit index set; and
  performing, by the encoder, Polar code encoding on the second bit vector to generate an encoded first code word.

In a first possible implementation manner of the first aspect, the acquiring, by an encoder, an information bit index set includes
  determining, by the encoder, the information bit index set according to a Frozen bit index set.

With reference to the first aspect or the first possible implementation manner of the first aspect, in a second possible implementation manner of the first aspect, the generating, by the encoder, a second bit vector according to a to-be-encoded first information bit and the information bit index set includes:
  performing, by the encoder, Polar code encoding on the to-be-encoded first information bit to generate an encoded second code word; and
  extracting, by the encoder from the encoded second code word, a bit corresponding to a sequence number of the information bit index set, and using the bit as the second bit vector.

With reference to the first aspect or the first possible implementation manner of the first aspect, in a third possible implementation manner of the first aspect, the generating, by the encoder, a second bit vector according to a to-be-encoded first information bit and the information bit index set includes:
  generating, by the encoder, a submatrix according to elements that are in a first matrix and respectively corresponding to a row index and a column index, wherein the row index and the column index belong to the information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix};$$

and
  performing, by the encoder by using the submatrix, linear transformation on the to-be-encoded first information bit to generate the second bit vector.

According to the third possible implementation manner of the first aspect, in a fourth possible implementation manner of the first aspect, the performing, by the encoder by using the submatrix, linear transformation on the to-be-encoded first information bit to generate the second bit vector includes:
  obtaining the second bit vector $u_B$ by using the following formula:

$$u_B = u_A \times G_{AA},$$

where
  $u_A$ is the first information bit, and $G_{AA}$ is the submatrix.

According to the third possible implementation manner of the first aspect, in a fifth possible implementation manner of the first aspect, the performing, by the encoder by using the submatrix, linear transformation on the to-be-encoded first information bit to generate the second bit vector includes:
  obtaining the second bit vector $u_B$ by using the following formula:

$$u_B = u_A \times \mathrm{mod}(\mathrm{inv}(G_{AA}), 2),$$

where
  $\mathrm{inv}(G_{AA})$ indicates that an inverse operation is performed on $G_{AA}$, and $\mathrm{mod}(\mathrm{inv}(G_{AA}), 2)$ indicates that an inverse operation is performed on $G_{AA}$, and inverse operation has been performed.

According to the third possible implementation manner of the first aspect, in a sixth possible implementation manner of the first aspect, the performing, by the encoder, Polar code encoding on the second bit vector to generate an encoded first code word is specifically:
  generating, by the encoder, a second matrix according to $F^{\otimes n}$; and performing, by the encoder by using a frozen bit and the second matrix, Polar encoding on the second bit vector to obtain the encoded first code word.

According to the sixth possible implementation manner of the first aspect, in a seventh possible implementation manner of the first aspect, the generating, by the encoder, a second matrix according to $F^{\otimes n}$ includes:

obtaining the second matrix $G_{N.}$ by using the following formula:

$$G_{N.}=B_N F^{\otimes n}.$$

According to the sixth possible implementation manner of the first aspect, in an eighth possible implementation manner of the first aspect, the generating, by the encoder, a second matrix according to $F^{\otimes n}$ includes:

obtaining the second matrix $G_{N.}$ by using the following formula:

$$G_{N.}=F^{\otimes n}.$$

According to the sixth possible implementation manner of the first aspect, in a ninth possible implementation manner of the first aspect, the performing, by the encoder by using a frozen bit and the second matrix, Polar encoding on the second bit vector to obtain the encoded first code word includes:

obtaining the encoded first code word $X_1^N$ by using the following formula:

$$X_1^N = u_B G_{N.}(A) \oplus u_{A^c} G_{N.}(A^C),$$

where
$u_B$ is the second bit vector, $u_{A^c}$ is the frozen bit, A is the information bit index set, $A^C$ is a frozen bit index set, $G_N(A)$ includes a row corresponding to an index of A that is in the second matrix $G_{N.}$, $G_{N.}(A^C)$ includes a row corresponding to an index of $A^C$ that is in $G_{N.}$, and $\oplus$ is a modulo 2 addition operation.

According to a second aspect of the present invention, a channel decoding method is provided, including:

acquiring, by a decoder, an information bit index set;
performing, by the decoder, Polar code decoding on a received to-be-decoded vector to generate a third bit vector; and
generating, by the decoder, a decoded fourth information bit according to the third bit vector and the information bit index set.

In a first possible implementation manner of the second aspect, the acquiring, by a decoder, an information bit index set includes: further including
determining, by the decoder, the information bit index set according to a Frozen bit index set.

With reference to the second aspect or the first possible implementation manner of the second aspect, in a second possible implementation manner of the second aspect, the generating, by the decoder, a decoded fourth information bit according to the third bit vector and the information bit index set includes:

performing, by the decoder, Polar code encoding on the third bit vector to generate an encoded second code word; and
extracting, by the decoder from the encoded second code word, a bit corresponding to a sequence number of the information bit index set, and using the bit as the decoded fourth information bit.

With reference to the second aspect or the first possible implementation manner of the second aspect, in a third possible implementation manner of the second aspect, the generating, by the decoder, a decoded fourth information bit according to the third bit vector and the information bit index set includes:

generating, by the decoder, a submatrix according to elements that are in a first matrix and respectively corresponding to a row index and a column index, wherein the row index and the column index belong to the information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix};$$

and
performing, by the decoder by using the submatrix, linear transformation on the third bit vector to generate the decoded fourth information bit.

According to the third possible implementation manner of the second aspect, in a fourth possible implementation manner of the second aspect, the performing, by the decoder by using the submatrix, linear transformation on the third bit vector to generate the decoded fourth information bit is specifically:

generating the fourth information bit $\hat{u}_A$ by using the following formula:

$$\hat{u}_A = \hat{u}_B \times G_{AA},$$

where
$\hat{u}_B$ is the third bit vector, and $G_{AA}$ is the submatrix.

According to the third possible implementation manner of the second aspect, in a fifth possible implementation manner of the second aspect, if the first matrix is $F^{\otimes n}$, before the performing, by the decoder by using the submatrix, linear transformation on the third bit vector to generate the decoded fourth information bit, the method further includes:

performing, by the decoder, bit inversion processing on the third bit vector; and
correspondingly, the performing, by the decoder by using the submatrix, linear transformation on the third bit vector to generate the decoded fourth information bit is specifically:
performing, according to the submatrix, linear transformation on the third bit vector on which the bit inversion processing has been performed, to generate the decoded fourth information bit.

According to a third aspect of the present invention, an encoder is provided, including:

a first determining module, configured to acquire an information bit index set;
a first generating module, configured to generate a second bit vector according to a to-be-encoded first information bit and the information bit index set; and
an encoding module, configured to perform Polar code encoding on the second bit vector to generate an encoded first code word.

In a first possible implementation manner of the third aspect, the first determining module is further configured to: before the generating a second bit vector according to a to-be-encoded first information bit and the information bit index set, determine the information bit index set according to a Frozen bit index set.

With reference to the third aspect or the first possible implementation manner of the third aspect, in a second possible implementation manner of the third aspect, the first generating module includes:

a first encoding unit, configured to perform Polar code encoding on the to-be-encoded first information bit to generate an encoded second code word; and a first extracting unit, configured to extract, from the encoded second code word, a bit corresponding to a sequence number of the information bit index set, and use the bit as the second bit vector.

With reference to the third aspect or the first possible implementation manner of the third aspect, in a third possible implementation manner of the third aspect, the first generating module includes:

a first generating unit, configured to generate a submatrix according to elements that are in a first matrix and respectively corresponding to a row index and a column index, wherein the row index and the column index belong to the information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F is $$\begin{bmatrix} 1 & 0 \\ 1 & 1 \end{bmatrix};$$

and a first transforming unit, configured to perform, by using the submatrix, linear transformation on the to-be-encoded first information bit to generate the second bit vector.

According to the third possible implementation manner of the third aspect, in a fourth possible implementation manner of the third aspect, the first transforming unit is specifically configured to:

obtain the second bit vector $u_B$ by using the following formula:

$$u_B = u_A \times G_{AA},$$

where $u_A$ is the first information bit, and $G_{AA}$ is the submatrix.

According to the third possible implementation manner of the third aspect, in a fifth possible implementation manner of the third aspect, the first transforming unit is specifically configured to:

obtain the second bit vector $u_B$ by using the following formula:

$$u_B = u_A \times \mathrm{mod}(\mathrm{inv}(G_{AA}), 2),$$

where $\mathrm{inv}(G_{AA})$ indicates that an inverse operation is performed on $G_{AA}$, and $\mathrm{mod}(\mathrm{inv}(G_{AA}), 2)$ indicates that a modulo 2 operation is performed on $G_{AA}$ on which the inverse operation has been performed.

According to the third possible implementation manner of the third aspect, in a sixth possible implementation manner of the third aspect, the encoding module is specifically configured to:

generate a second matrix according to $F^{\otimes n}$, and perform, by using a frozen bit and the second matrix, Polar encoding on the second bit vector to obtain the encoded first code word.

According to the sixth possible implementation manner of the third aspect, in a seventh possible implementation manner of the third aspect, the encoding module is further configured to:

obtain the second matrix $G_N$ by using the following formula:

$$G_N = B_N F^{\otimes n}.$$

According to the sixth possible implementation manner of the third aspect, in an eighth possible implementation manner of the third aspect, the encoding module is further configured to:

obtain the second matrix $G_N$ by using the following formula:

$$G_N = F^{\otimes n}.$$

According to the sixth possible implementation manner of the third aspect, in a ninth possible implementation manner of the third aspect, the encoding module is further configured to:

generate the encoded first code word $X_1^N$ by using the following formula:

$$X_1^N = u_B G_N(A) \oplus u_{A^C} G_N(A^C),$$

where $u_B$ is the second bit vector, $u_{A^C}$ is the frozen bit, A is the information bit index set, $A^C$ is a frozen bit index set, $G_N(A)$ includes a row corresponding to an index of A that is in the second matrix $G_N$, $G_N(A^C)$ includes a row corresponding to an index of $A^C$ that is in $G_N$, and $\oplus$ is a modulo 2 addition operation.

According to a fourth aspect of the present invention, a decoder is provided, including:

a second determining module, configured to acquire an information bit index set;

a decoding module, configured to perform Polar code decoding on a received to-be-decoded vector to generate a third bit vector; and a second generating module, configured to acquire the information bit index set, and generate a decoded fourth information bit according to the third bit vector and the information bit index set.

In a first possible implementation manner of the fourth aspect, the second determining module is further configured to: before the generating a decoded fourth information bit according to the third bit vector and the information bit index set, determine the information bit index set according to a Frozen bit index set.

With reference to the fourth aspect or the first possible implementation manner of the fourth aspect, in a second possible implementation manner of the fourth aspect, the second generating module includes:

a second encoding unit, configured to perform Polar code encoding on the third bit vector to generate an encoded second code word; and a second extracting unit, configured to extract, from the encoded second code word, a bit corresponding to a sequence number of the information bit index set, and use the bit as the decoded fourth information bit.

With reference to the fourth aspect or the first possible implementation manner of the fourth aspect, in a third possible implementation manner of the fourth aspect, the second generating module includes:

a second generating unit, configured to generate a submatrix according to elements that are in a first matrix and respectively corresponding to a row index and a column index, wherein the row index and the column index belong to the information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix};$$

and a second transforming unit, configured to perform, by using the submatrix, linear transformation on the third bit vector to generate the decoded fourth information bit.

According to the third possible implementation manner of the fourth aspect, in a fourth possible implementation manner of the fourth aspect, the second transforming unit is specifically configured to:

obtain the fourth information bit $\hat{u}_A$ by using the following formula:

$$\hat{u}_A = \hat{u}_B \times G_{AA},$$

where $\hat{u}_B$ is the third bit vector, and $G_{AA}$ is the submatrix.

According to the third possible implementation manner of the fourth aspect, in a fifth possible implementation manner of the fourth aspect, the decoder further includes:

an inversion module, configured to: if the first matrix is $F^{\otimes n}$, perform bit inversion processing on the third bit vector; and correspondingly, the second transforming unit is specifically configured to:

perform, by using the submatrix, linear transformation on the third bit vector on which the bit inversion processing has been performed, to generate the decoded fourth information bit.

According to the channel encoding and decoding method and apparatus provided in the embodiments of the present invention, an encoder first acquires an information bit index set, generates a second bit vector according to a to-be-encoded first information bit and the information bit index set, and then performs Polar code encoding on the second bit vector to generate an encoded first code word, which can implement that a Polar code is converted into a system code in a manner with relatively low complexity, and can improve bit error rate performance of the Polar code.

BRIEF DESCRIPTION OF DRAWINGS

To describe the technical solutions in the embodiments of the present invention more clearly, the following briefly introduces the accompanying drawings required for describing the embodiments or the prior art. Apparently, the accompanying drawings in the following description show some embodiments of the present invention, and persons of ordinary skill in the art may still derive other drawings from these accompanying drawings without creative efforts.

DESCRIPTION OF EMBODIMENTS

To make the objectives, technical solutions, and advantages of the embodiments of the present invention clearer, the following clearly describes the technical solutions in the embodiments of the present invention with reference to the accompanying drawings in the embodiments of the present invention. Apparently, the described embodiments are a part rather than all of the embodiments of the present invention. All other embodiments obtained by persons of ordinary skill in the art based on the embodiments of the present invention without creative efforts shall fall within the protection scope of the present invention.

To make the objectives, technical solutions, and advantages of the embodiments of the present invention clearer, the following clearly and completely describes the technical solutions in the embodiments of the present invention with reference to the accompanying drawings in the embodiments of the present invention.

Figure 1:
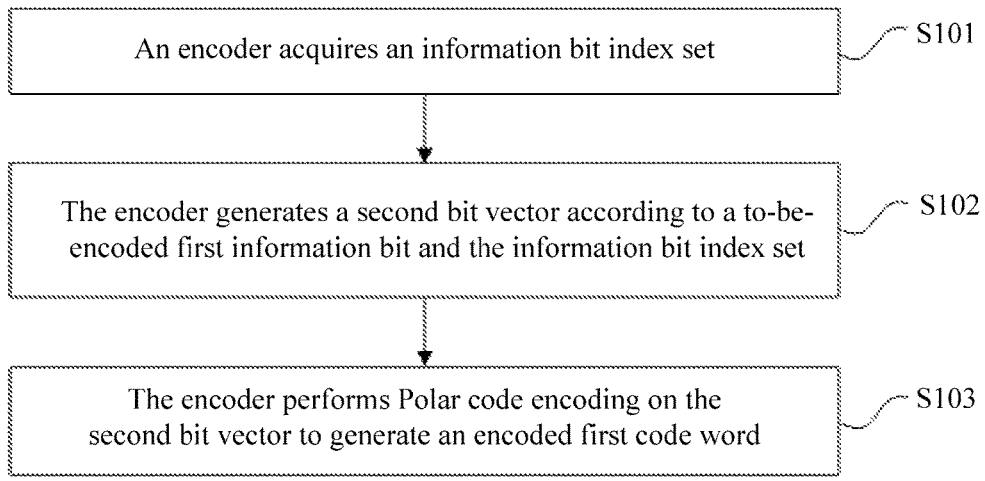
FIG. 1 is a flowchart of Embodiment 1 of a channel encoding method according to the present invention.

FIG. 1 is a flowchart of Embodiment 1 of a channel encoding method according to the present invention. As shown in FIG. 1, the channel encoding method of this embodiment is executed by a device that has an encoding capability or an encoder, and the method includes:

S101. An encoder acquires an information bit index set.

S102. The encoder generates a second bit vector according to a to-be-encoded first information bit and the information bit index set.

Specifically, the information bit index set is determined in a Polar code construction process, and when a Polar code is used, the information bit index set is known. Generating the second bit vector according to the to-be-encoded first information bit and the information bit index set may specifically be: performing linear transformation according to an information bit index set determined in the Polar code construction process, on the first information bit to generate the second bit vector.

S103. The encoder performs Polar code encoding on the second bit vector to generate an encoded first code word.

Specifically, by using the foregoing generated second bit vector, a frozen bit, and a Polar code generator matrix, Polar code encoding may be performed to generate the encoded first code word, where the frozen bit is a specific bit in a Polar code, and the frozen bit is known and may be set to 0.

The code word obtained after Polar code encoding does not include an information bit, and is a non-system code. However, by means of numerical simulation and verification, it can be learned that according to the channel encoding method of this embodiment, a non-system Polar code may be transformed into a system code, and complexity of the channel encoding method of this embodiment is still O(NlogN). In the prior art, after a Polar code is transformed into a system code by using a Gaussian elimination based method (Gaussian elimination based method), complexity of the Polar code increases to O($N^3$). In addition, compared with the prior art, in the encoding method of this embodiment, better bit error rate performance can be achieved under a same condition.

According to the channel encoding method provided in this embodiment, an encoder first acquires an information bit index set, generates a second bit vector according to a to-be-encoded first information bit and the information bit index set, and then performs Polar code encoding on the second bit vector to generate an encoded first code word, which can implement that a Polar code is converted into a system code in a manner with relatively low complexity, and can improve bit error rate performance of the Polar code.

Figure 2:
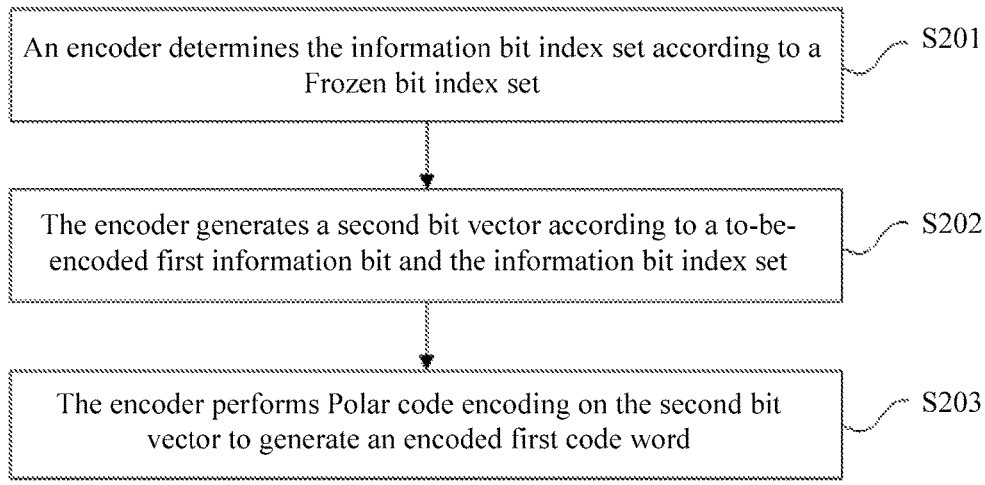
FIG. 2 is a flowchart of Embodiment 2 of a channel encoding method according to the present invention.

FIG. 2 is a flowchart of Embodiment 2 of a channel encoding method according to the present invention. This embodiment is for a scenario in which a Frozen bit index set is first learned about, and then an information bit index set is determined according to the Frozen bit index set. As shown in FIG. 2, the channel encoding method of this embodiment includes the following steps:

S201. An encoder determines the information bit index set according to the Frozen bit index set.

Specifically, during use of a Polar code, the encoder may determine the Frozen bit index set according to the information bit index set, and may also determine the information bit index set according to the Frozen bit index set. The information bit index set and the Frozen bit index set are in a complementary relationship in a same code length. Therefore, if the Frozen bit index set is learned about, the information bit index set may first be determined according to the Frozen bit index set, and a second bit vector is generated according to a to-be-encoded first information bit and the information bit index set.

S202. The encoder generates a second bit vector according to a to-be-encoded first information bit and the information bit index set.

S203. The encoder performs Polar code encoding on the second bit vector to generate an encoded first code word.

According to the channel encoding method provided in this embodiment, an encoder first determines an information bit index set according to a Frozen bit index set, then generates a second bit vector according to a to-be-encoded first information bit and the information bit index set, and then performs Polar code encoding on the second bit vector to generate an encoded first code word, which can implement that a Polar code is converted into a system code in a manner with relatively low complexity, and can improve bit error rate performance of the Polar code.

Figure 3:
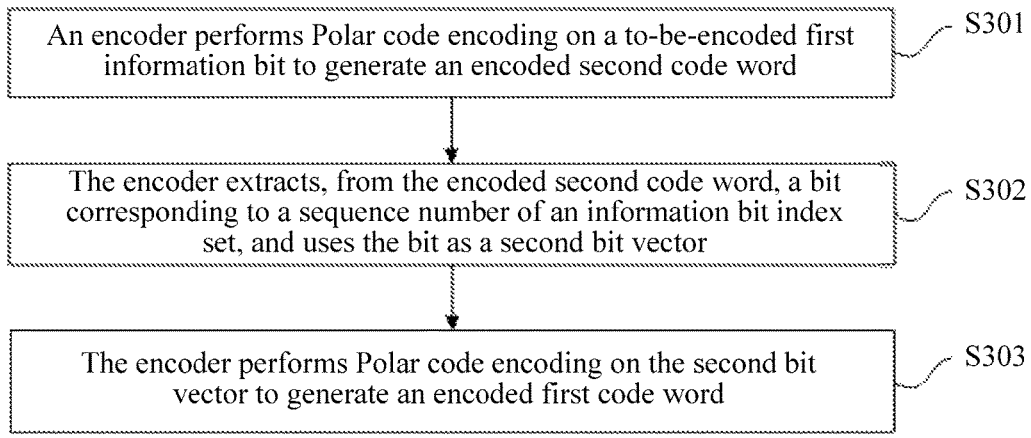
FIG. 3 is a flowchart of Embodiment 3 of a channel encoding method according to the present invention.

FIG. 3 is a flowchart of Embodiment 3 of a channel encoding method according to the present invention. As shown in FIG. 3, on the basis of the embodiment shown in FIG. 1, the channel encoding method of this embodiment describes a possible implementation manner of S102, which includes the following steps:

S301. An encoder performs Polar code encoding on a to-be-encoded first information bit to generate an encoded second code word.

S302. The encoder extracts, from the encoded second code word, a bit corresponding to a sequence number of an information bit index set, and uses the bit as a second bit vector.

Specifically, S102 in the embodiment shown in FIG. 1 may be specifically implemented by S301 and S302 in this embodiment. First, the encoder performs Polar code encoding on the to-be-encoded first information bit and a frozen bit, and then extracts, from the encoded second code word, the bit corresponding to the sequence number of the information bit index set and uses the bit as the second bit vector, where the information bit index set is determined in a Polar code construction process. When a Polar code is used, the information bit index set is known. Another possible situation is: a Frozen bit index set is known; first, the information bit index set is determined according to the Frozen bit index set, and then the bit corresponding to the sequence number of the information bit index set is extracted from the encoded second code word and used as the second bit vector, which can implement that by using a Polar code encoding algorithm, the second bit vector is quickly generated according to the to-be-encoded first information bit and the information bit index set.

S303. The encoder performs Polar code encoding on the second bit vector to generate an encoded first code word.

According to the channel encoding method provided in this embodiment, an encoder first quickly generates a second bit vector according to a to-be-encoded first information bit and an information bit index set by using a Polar code encoding algorithm, and then performs Polar code encoding on the second bit vector to generate an encoded first code word, which can implement that a Polar code is converted into a system code in a manner with relatively low complexity, and can improve bit error rate performance of the Polar code.

Figure 4:
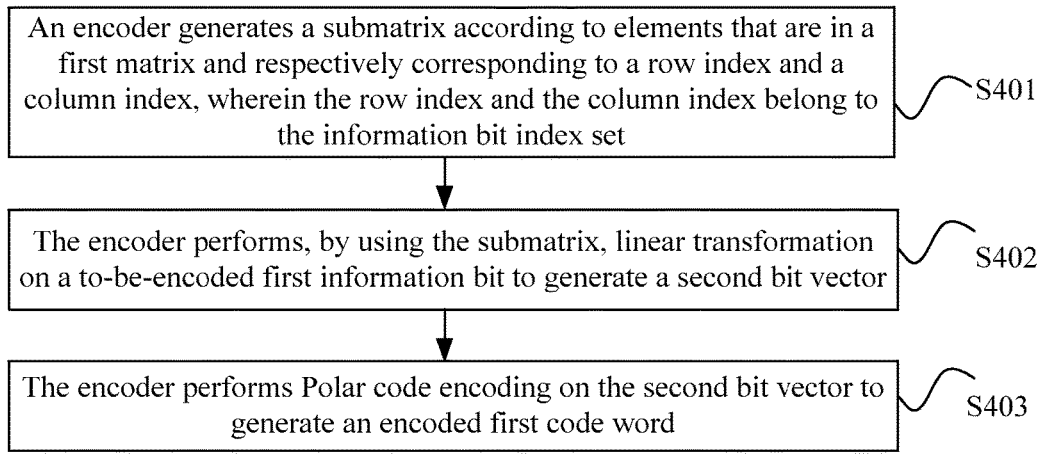
FIG. 4 is a flowchart of Embodiment 4 of a channel encoding method according to the present invention.

FIG. 4 is a flowchart of Embodiment 4 of a channel encoding method according to the present invention. As shown in FIG. 4, on the basis of the embodiment shown in FIG. 1, the channel encoding method of this embodiment describes another possible implementation manner of S102, which includes the following steps:

S401. An encoder generates a submatrix according to elements that are in a first matrix and respectively corresponding to a row index and a column index of an information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix};$$

a to-be-encoded first information bit may be a bit vector including K bits, where K≥1.

S402. The encoder performs, by using the submatrix, linear transformation on the to-be-encoded first information bit to generate a second bit vector.

Specifically, S102 in the embodiment shown in FIG. 1 may be specifically implemented by S401 and S402 in this embodiment. The foregoing first matrix $B_N F^{\otimes n} B_N$ or $F^{\otimes n}$ may be determined according to a generator matrix of an original Polar code. The submatrix may be obtained from the elements that are in the first matrix $B_N F^{\otimes n} B_N$ or $F^{\otimes n}$ and corresponding to a row index and a column index, where the row index and the column index belong to the information bit index set The information bit index set is determined in a Polar code construction process, and when a Polar code is used, the information bit index set and a Frozen bit index set are known.

S403. The encoder performs Polar code encoding on the second bit vector to generate an encoded first code word.

According to the channel encoding method provided in this embodiment, an encoder first performs, according to a submatrix, linear transformation on a to-be-encoded first information bit to generate a second bit vector, and then performs Polar code encoding on the second bit vector to generate an encoded first code word, which can implement that a Polar code is converted into a system code in a manner with relatively low complexity, and can improve bit error rate performance of the Polar code.

Further, on the basis of the embodiment shown in FIG. 4, S402 may specifically include:

obtaining the second bit vector $u_B$ by using the following formula:

$$u_B = u_A \times G_{AA},$$

where $u_A$ is the first information bit, and $G_{AA}$ is the submatrix.

Further, on the basis of the embodiment shown in FIG. 4, S402 may further specifically include:

obtaining the second bit vector $u_B$ by using the following formula:

$$u_B = u_A \times \mathrm{mod}(\mathrm{inv}(G_{AA}), 2),$$

where $\mathrm{inv}(G_{AA})$ indicates that an inverse operation is performed on $G_{AA}$, and $\mathrm{mod}(\mathrm{inv}(G_{AA}), 2)$ indicates that a modulo 2 operation is performed on $G_{AA}$ on which the inverse operation has been performed.

The foregoing two manners may both implement that the second bit vector $u_B$ is generated by using the submatrix $G_{AA}$ to perform linear transformation on the to-be-encoded first information bit $u_A$.

Further, on the basis of the embodiment shown in FIG. 4, S403 may be specifically:

generating, by the encoder, a second matrix according to $F^{\otimes n}$; and performing, by the encoder by using a frozen bit and the second matrix, Polar encoding on the second bit vector to obtain the encoded first code word.

Specifically, the second matrix may be a Polar code generator matrix. A manner in which the encoder generates the second matrix according to $F^{\otimes n}$ may specifically include two manners:

manner 1: obtaining the second matrix $G_N$ by using the following formula:

$$G_N = B_N F^{\otimes n};$$

and manner 2: obtaining the second matrix $G_N$ by using the following formula:

$$G_N = F^{\otimes n}.$$

A difference between manner 1 and manner 2 is as follows: if a bit inversion operation of Polar code encoding and decoding is performed at a transmit end, manner 1 is used to generate the second matrix according to $F^{\otimes n}$, where the transmit end is an end at which Polar code encoding is performed; if the bit inversion operation of Polar code encoding and decoding is performed at a receive end, manner 2 is used to generate the second matrix according to $F^{\otimes n}$, where the receive end is an end at which Polar code decoding is performed.

Still further, in S403, the performing, by the encoder by using a frozen bit and the second matrix, Polar encoding on the second bit vector to obtain the encoded first code word may include:

obtaining the encoded first code word $X_1^N$ by using the following formula:

$$X_1^N = u_B G_N(A) \oplus u_{A^c} G_N(A^C),$$

where $u_B$ is the second bit vector, $u_{A^c}$ is the frozen bit, A is the information bit index set, $A^C$ is a frozen bit index set, $G_N(A)$ includes a row corresponding to an index of A that is in the second matrix $G_N$, $G_N(A^C)$ includes a row corresponding to an index of $A^C$ that is in $G_N$, and $\oplus$ is a modulo 2 addition operation.

It may be understood that, according to another expression manner of a Polar code encoding process, Polar code encoding may also be performed on the second bit vector to generate the encoded first code word, which may be specifically:

obtaining the encoded first code word $X_1^N$ by using the following formula:

$$X_1^N = u_1^N G_N,$$

where $G_N$ is a generator matrix, and $u_1^N$ is a bit vector obtained from the second bit vector $u_B$ and the frozen bit $u_{A^c}$.

Figure 5:
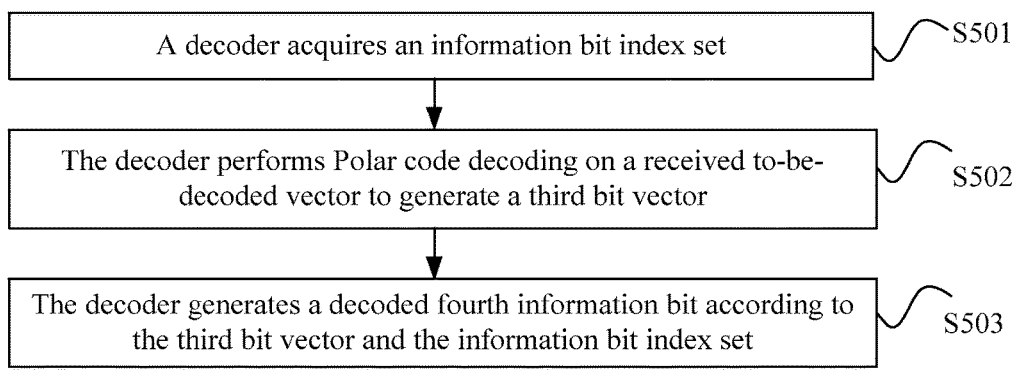
FIG. 5 is a flowchart of Embodiment 1 of a channel decoding method according to the present invention.

FIG. 5 is a flowchart of Embodiment 1 of a channel decoding method according to the present invention. As shown in FIG. 5, the channel decoding method of this embodiment includes the following steps:

S501. A decoder acquires an information bit index set.

S502. The decoder performs Polar code decoding on a received to-be-decoded vector to generate a third bit vector.

Specifically, a decoding method such as successive cancellation (Successive Cancellation, SC for short) decoding, List decoding, or BP decoding may be used to perform Polar code decoding on a received to-be-decoded vector to generate a third bit vector.

S503. The decoder generates a decoded fourth information bit according to the third bit vector and the information bit index set.

Specifically, the information bit index set is determined in a Polar code construction process, and when a Polar code is used, the information bit index set is known. Generating the decoded fourth information bit according to the third bit vector and the information bit index set may implement that linear transformation is performed, according to an information bit index set determined in the Polar code construction process, on the third bit vector to generate the fourth information bit.

According to the channel decoding method provided in this embodiment, a decoder first acquires an information bit index set, performs Polar code decoding on a to-be-decoded vector to generate a third bit vector, and then generates a decoded fourth information bit according to the third bit vector and the information bit index set, which can implement that a Polar code is converted into a system code in a manner with relatively low complexity, and can improve bit error rate performance of the Polar code.

Figure 6:
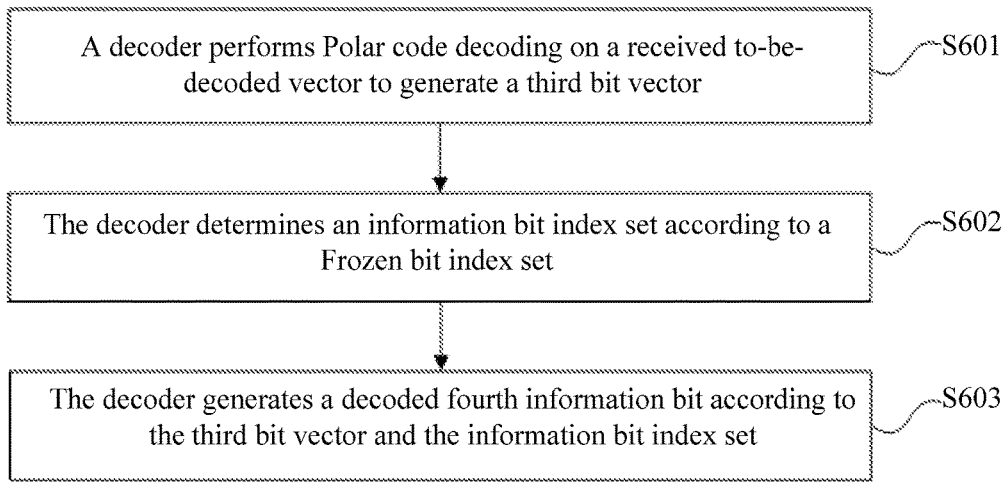
FIG. 6 is a flowchart of Embodiment 2 of a channel decoding method according to the present invention.

FIG. 6 is a flowchart of Embodiment 2 of a channel decoding method according to the present invention. This embodiment is for a scenario in which a Frozen bit index set is first learned about, and then an information bit index set is determined according to the Frozen bit index set. As shown in FIG. 6, the channel decoding method of this embodiment includes the following steps:

S601. A decoder performs Polar code decoding on a received to-be-decoded vector to generate a third bit vector.

S602. The decoder determines the information bit index set according to the Frozen bit index set.

Specifically, during use of a Polar code, the Frozen bit index set may be determined according to the information bit index set, and the information bit index set may also be determined according to the Frozen bit index set. The information bit index set and the Frozen bit index set are in a complementary relationship in a same code length. Therefore, if the Frozen bit index set is learned about, the information bit index set may first be determined according to the Frozen bit index set, and then a decoded fourth information bit is generated according to the third bit vector and the information bit index set.

S603. The decoder generates a decoded fourth information bit according to the third bit vector and the information bit index set.

According to the channel decoding method provided in this embodiment, a decoder first performs Polar code decoding on a to-be-decoded vector to generate a third bit vector, determines an information bit index set according to a Frozen bit index set, and then generates a decoded fourth information bit according to the third bit vector and the information bit index set, which can implement that a Polar code is converted into a system code in a manner with relatively low complexity, and can improve bit error rate performance of the Polar code.

Figure 7:
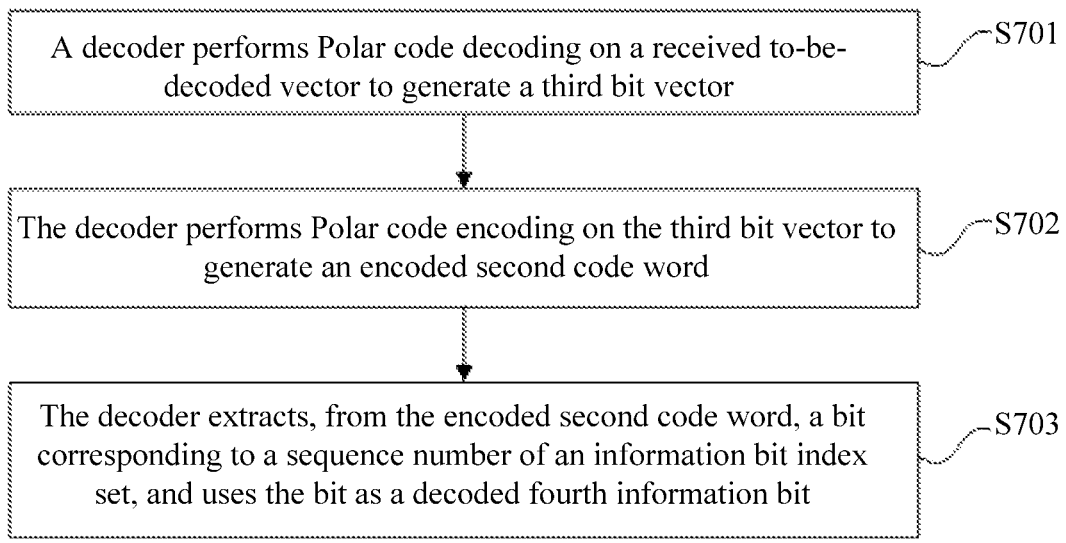
FIG. 7 is a flowchart of Embodiment 3 of a channel decoding method according to the present invention.

FIG. 7 is a flowchart of Embodiment 3 of a channel decoding method according to the present invention. As shown in FIG. 7, on the basis of the embodiment shown in FIG. 5, the channel decoding method of this embodiment describes a possible implementation manner of S503, which includes the following steps:

S701. A decoder performs Polar code decoding on a received to-be-decoded vector to generate a third bit vector.

S702. The decoder performs Polar code encoding on the third bit vector to generate an encoded second code word.

S703. The decoder extracts, from the encoded second code word, a bit corresponding to a sequence number of an information bit index set, and uses the bit as a decoded fourth information bit.

Specifically, S503 in the embodiment shown in FIG. 5 may be specifically implemented by S702 and S703 in this embodiment. First, Polar code encoding is performed on the third bit vector and a frozen bit, and then the bit corresponding to the sequence number of the information bit index set is extracted from the encoded second code word and used as the decoded fourth information bit, where the information bit index set is determined in a Polar code construction process. When a Polar code is used, the information bit index set is known. Another possible situation is: a Frozen bit index set is known; first, the information bit index set is determined according to the Frozen bit index set, and then the bit corresponding to the sequence number of the information bit index set is extracted from the encoded second code word and used as the decoded fourth information bit, which can implement that by using a Polar code encoding algorithm, the bit corresponding to the sequence number of the information bit index set is quickly extracted from the encoded second code word and used as the decoded fourth information bit.

According to the channel decoding method provided in this embodiment, a decoder first performs Polar code decoding on a received to-be-decoded vector to generate a third bit vector, and then uses a Polar code encoding algorithm to quickly extract, from an encoded second code word, a bit corresponding to a sequence number of an information bit index set and use the bit as a decoded fourth information bit, which can implement that a Polar code is converted into a system code in a manner with relatively low complexity, and can improve bit error rate performance of the Polar code.

Figure 8:
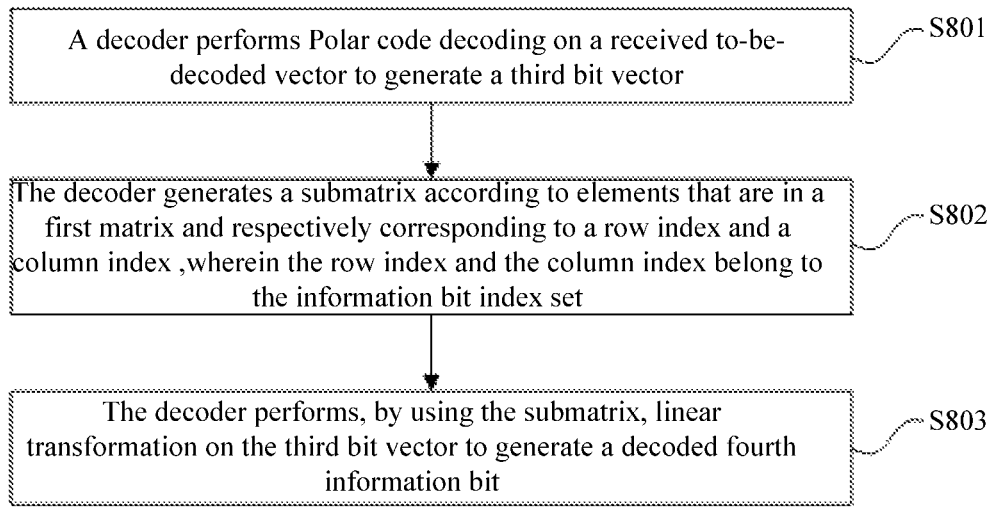
FIG. 8 is a flowchart of Embodiment 4 of a channel decoding method according to the present invention.

FIG. 8 is a flowchart of Embodiment 4 of a channel decoding method according to the present invention. As shown in FIG. 8, on the basis of the embodiment shown in FIG. 5, the channel decoding method of this embodiment describes another possible implementation manner of S503, which includes the following steps:

S801. A decoder performs Polar code decoding on a received to-be-decoded vector to generate a third bit vector.

Specifically, a decoding method such as SC decoding, List decoding, or BP decoding may be used to perform Polar code decoding on a received to-be-decoded vector to generate a third bit vector.

S802. The decoder generates a submatrix according to elements that are in a first matrix and respectively corresponding to a row index and a column index of an information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix}.$$

S803. The decoder performs, by using the submatrix, linear transformation on the third bit vector to generate a decoded fourth information bit.

The submatrix includes the elements that are in the first matrix $B_N F^{\otimes n} B_N$ or $F^{\otimes n}$ and respectively corresponding to the row index and the column index of the information bit index set, where $B_N$ is the transposed matrix, and $F^{\otimes n}$ indicates the $n^{th}$ Kronecker product of F, where F is $$\begin{bmatrix} 1 & 0 \\ 1 & 1 \end{bmatrix}.$$

Specifically, S503 in the embodiment shown in FIG. 5 may be specifically implemented by S802 and S803 in this embodiment. The foregoing first matrix $B_N F^{\otimes n} B_N$ or $F^{\otimes n}$ may be determined according to a generator matrix of an original Polar code. The submatrix may be obtained from the row index and the column index that are in the first matrix $B_N F^{\otimes n} B_N$ or $F^{\otimes n}$ and in the information bit index set. The information bit index set or a Frozen bit index set is determined in a Polar code construction process, and when a Polar code is used, the information bit index set or the Frozen bit index set is known.

According to the channel decoding method provided in this embodiment, a decoder first performs Polar code decoding on a received to-be-decoded vector to generate a third bit vector, and then performs, by using a submatrix, linear transformation on the third bit vector to generate a decoded fourth information bit, which can implement that a Polar code is converted into a system code in a manner with relatively low complexity, and can improve bit error rate performance of the Polar code.

Further, in Embodiment 5 of a channel decoding method provided in the present invention, on the basis of the embodiment shown in FIG. 8, S803 may include:

obtaining the fourth information bit $\hat{u}_A$ by using the following formula:

$$\hat{u}_A = \hat{u}_B \times G_{AA},$$

where $\hat{u}_B$ is the third bit vector, and $G_{AA}$ is the submatrix.

Specifically, the fourth information bit $\hat{u}_A$ may be a decision value of a first information bit $u_A$, and the third bit vector $\hat{u}_B$ may be a decision value of a second bit vector $u_B$.

Figure 9:
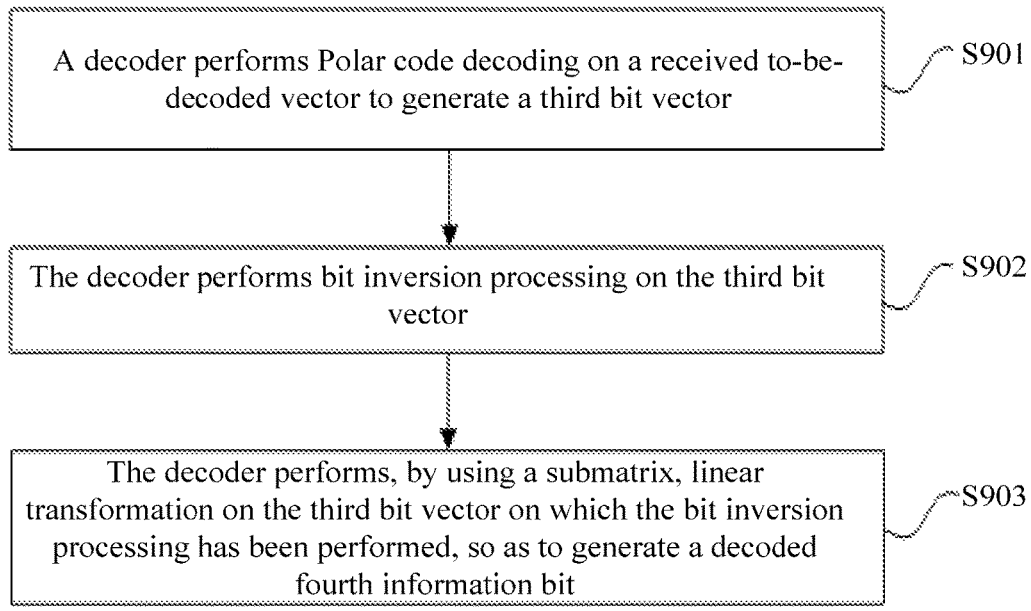
FIG. 9 is a flowchart of Embodiment 5 of a channel decoding method according to the present invention.

FIG. 9 is a flowchart of Embodiment 5 of a channel decoding method according to the present invention. As shown in FIG. 9, the channel decoding method of this embodiment is for a scenario in which a bit inversion operation is performed at a receive end. On the basis of the embodiment shown in FIG. 8, the channel decoding method of this embodiment includes the following steps:

S901. A decoder performs Polar code decoding on a received to-be-decoded vector to generate a third bit vector.

S902. The decoder performs bit inversion processing on the third bit vector.

Specifically, if a bit inversion operation of Polar code encoding and decoding is performed at a receive end, where the receive end is an end at which Polar code decoding is performed, and a first matrix is $F^{\otimes n}$, S902 needs to be performed in the channel decoding method provided in this embodiment.

S903. The decoder performs, by using a submatrix, linear transformation on the third bit vector on which the bit inversion processing has been performed, to generate a decoded fourth information bit.

According to the channel decoding method provided in this embodiment, for a scenario in which a bit inversion operation is performed at a receive end, a decoder first performs Polar code decoding on a received to-be-decoded vector to generate a third bit vector, performs bit inversion processing on the third bit vector, and then performs, according to a submatrix, linear transformation on the third bit vector on which the bit inversion processing has been performed, to generate a decoded fourth information bit, which can implement that a Polar code is converted into a system code in a manner with relatively low complexity, and can improve bit error rate performance of the Polar code.

Figure 10:
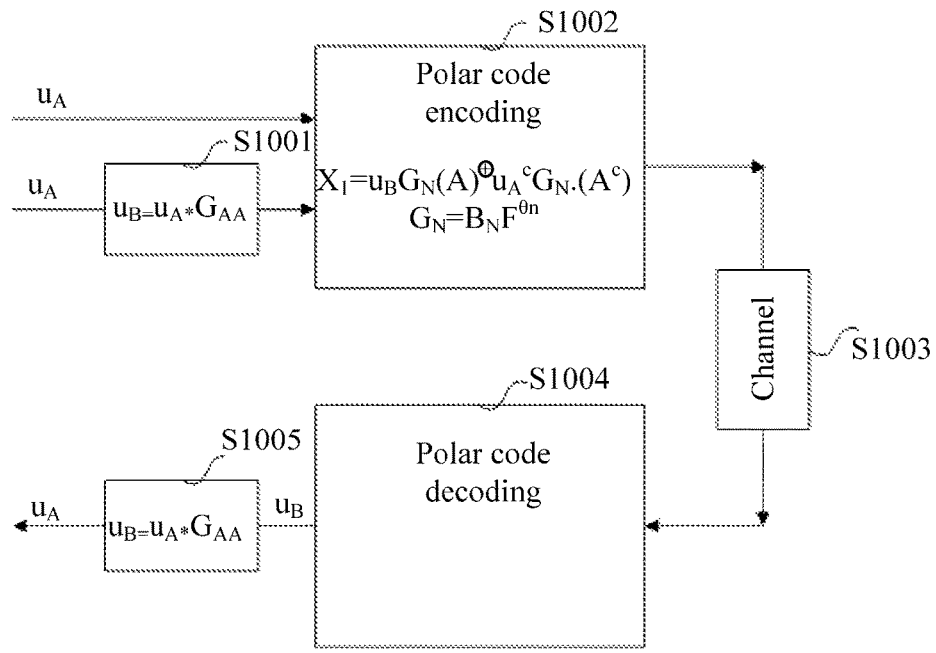
FIG. 10 is a schematic diagram of Embodiment 1 of a channel encoding and decoding method according to the present invention.

The following further describes a channel encoding and decoding method provided in the present invention. FIG. 10 is a schematic diagram of Embodiment 1 of a channel encoding and decoding method according to the present invention. As shown in FIG. 10, the channel encoding and decoding method of this embodiment may include the following steps:

S1001. An encoder performs, by using a submatrix $G_{AA}$, linear transformation on a to-be-encoded first information bit $u_A$ to generate a second bit vector $u_B$.

S1002. The encoder generates a second matrix $G_N$ according to $F^{\otimes n}$, and performs, by using a frozen bit and the second matrix, Polar encoding on the second bit vector to obtain an encoded first code word.

Specifically, the encoded first code word $X_1^N$ may be obtained by using the following formula:

$$X_1^N = u_B G_N(A) \oplus u_{A^c} G_N(A^c),$$

where $u_B$ is the second bit vector, $u_{A^c}$ is the frozen bit, A is an information bit index set, $A^C$ is a frozen bit index set, $G_N(A)$ includes a row corresponding to an index of A that is in the second matrix $G_N$, $G_N(A^C)$ includes a row corresponding to an index of $A^C$ that is in $G_N$, and $\oplus$ is a modulo 2 addition operation.

Optionally, manner 1 shown in FIG. 5 may be used to generate the second matrix $G_N$; if a bit inversion operation of Polar code encoding and decoding is performed at a receive end, manner 2 is used to generate the second matrix $G_N$ according to $F^{\otimes n}$, where the receive end is an end at which Polar code decoding is performed.

It may be understood that, according to another expression manner of a Polar code encoding process, Polar code encoding may also be performed on the second bit vector $u^B$ to generate the encoded first code word, which may specifically include:

obtaining the encoded first code word $X_1^N$ by using the following formula:

$$X_1^N = u_1^N G_N,$$

where $G_N$ is a generator matrix, and $u_1^N$ is a bit vector obtained from the second bit vector $u_B$ and the frozen bit $u_{A^c}$.

S1003. The encoder transmits, by using a channel, information obtained after Polar code encoding.

S1004. A decoder performs Polar code decoding on a received to-be-decoded vector to generate a third bit vector $\hat{u}_B$.

S1005. The decoder performs, by using a submatrix $G_{AA}$, linear transformation on the third bit vector $\hat{u}_B$ to generate a decoded fourth information bit $\hat{u}_A$.

According to the channel encoding and decoding method provided in this embodiment, an encoder first performs, at a transmit end by using a submatrix, linear transformation on a to-be-encoded first information bit to generate a second bit vector, and performs Polar code encoding on the second bit vector to generate an encoded first code word; after receiving a to-be-decoded vector at a receive end, a decoder performs Polar code decoding on the to-be-decoded vector to generate a third bit vector, and then performs, by using the submatrix, linear transformation on the third bit vector to generate a decoded fourth information bit, which can implement that a Polar code is converted into a system code in a manner with relatively low complexity, and can improve bit error rate performance of the Polar code.

Figure 11:
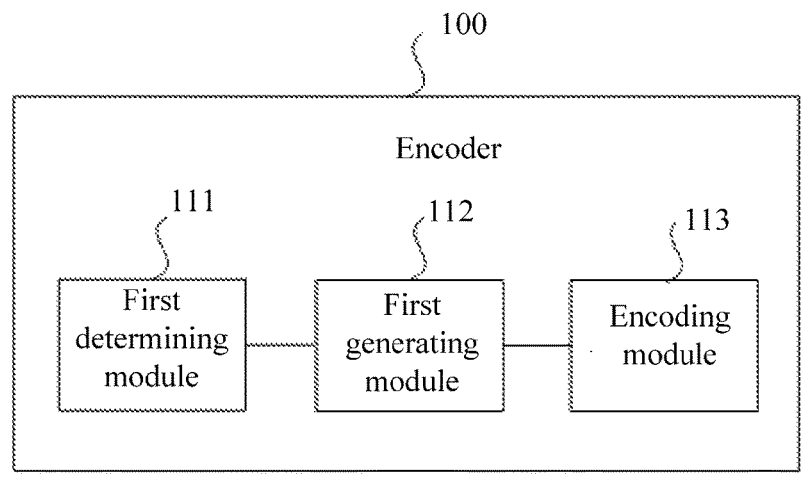
FIG. 11 is a schematic structural diagram of Embodiment 1 of an encoder according to the present invention.

FIG. 11 is a schematic structural diagram of Embodiment 1 of an encoder according to the present invention. As shown in FIG. 11, an encoder 100 of this embodiment includes a first determining module 111, a first generating module 112, and an encoding module 113, where the first determining module 111 is configured to acquire an information bit index set, the first generating module 112 is configured to generate a second bit vector according to a to-be-encoded first information bit and the information bit index set, and the encoding module 113 is configured to perform Polar code encoding on the second bit vector to generate an encoded first code word.

Optionally, the first determining module 111 may be further configured to: before the generating a second bit vector according to a to-be-encoded first information bit and the information bit index set, determine the information bit index set according to a Frozen bit index set.

The encoder 100 of this embodiment may be configured to implement the method embodiment shown in FIG. 1 or FIG. 2, and implementation principles and technical effects of the encoder 100 are similar and are not described herein again.

Figure 12:
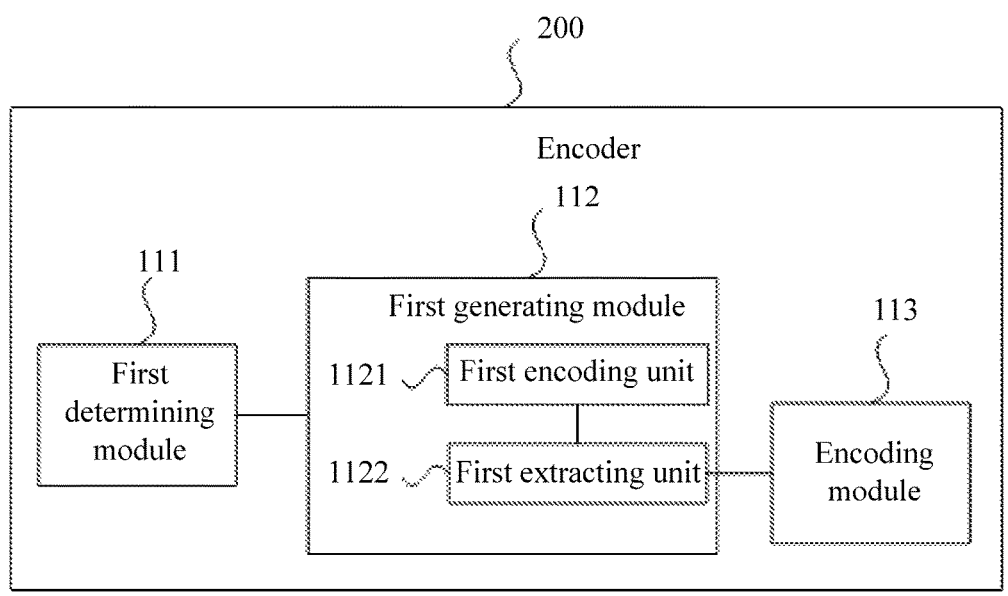
FIG. 12 is a schematic structural diagram of Embodiment 2 of an encoder according to the present invention.

FIG. 12 is a schematic structural diagram of Embodiment 2 of an encoder according to the present invention. As shown in FIG. 12, according to an encoder 200 of this embodiment, on the basis of the embodiment shown in FIG. 11, a first generating module 112 may include a first encoding unit 1121 and a first extracting unit 1122, where the first encoding unit 1121 is configured to perform Polar code encoding on a to-be-encoded first information bit to generate an encoded second code word, and the first extracting unit 1122 is configured to extract, from the encoded second code word, a bit corresponding to a sequence number of an information bit index set and use the bit as a second bit vector.

The encoder 200 of this embodiment may be configured to implement the method embodiment shown in FIG. 3, and implementation principles and technical effects of the encoder 200 are similar and are not described herein again.

Figure 13:
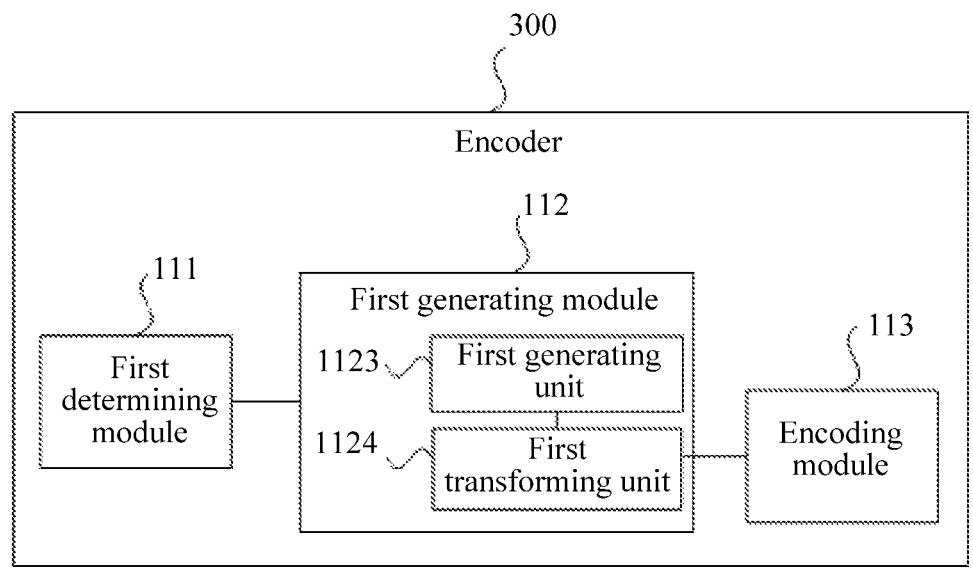
FIG. 13 is a schematic structural diagram of Embodiment 3 of an encoder according to the present invention.

FIG. 13 is a schematic structural diagram of Embodiment 3 of an encoder according to the present invention. As shown in FIG. 13, according to an encoder 300 of this embodiment, on the basis of the embodiment shown in FIG. 11, a first generating module 112 may include a first generating unit 1123 and a first transforming unit 1124, where the first generating unit 1123 is configured to generate a submatrix according to elements that are in a first matrix and respectively corresponding to a row index and a column index of an information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix};$$

the first transforming unit 1124 is configured to perform, by using the submatrix, linear transformation on a to-be-encoded first information bit to generate a second bit vector.

The encoder 300 of this embodiment may be configured to implement the method embodiment shown in FIG. 4, and implementation principles and technical effects of the encoder 300 are similar and are not described herein again.

Further, on the basis of the embodiment shown in FIG. 13, the foregoing first transforming unit 1124 may be specifically configured to:
obtain the second bit vector $u_B$ by using the following formula:

$$u_B = u_A \times G_{AA},$$

where
$u_A$ is the first information bit, and $G_{AA}$ is the submatrix.

Further, on the basis of the embodiment shown in FIG. 13, the foregoing first transforming unit 1124 may be specifically configured to:
obtain the second bit vector $u_B$ by using the following formula:

$$u_B = u_A \times \mathrm{mod}(\mathrm{inv}(G_{AA}), 2),$$

where
$\mathrm{inv}(G_{AA})$ indicates that an inverse operation is performed on $G_{AA}$, and $\mathrm{mod}(\mathrm{inv}(G_{AA}), 2)$ indicates that a modulo 2 operation is performed on $G_{AA}$ on which the inverse operation has been performed.

Still further, on the basis of the embodiment shown in FIG. 13, the foregoing encoding module 113 may be specifically configured to generate a second matrix according to $F^{\otimes n}$; and
perform, by using a frozen bit and the second matrix, Polar encoding on the second bit vector to obtain an encoded first code word.

Still further, on the basis of the embodiment shown in FIG. 13, the foregoing encoding module 113 may further be specifically configured to:
obtain the second matrix $G_N$ by using the following formula:

$$G_N = B_N F^{\otimes n}.$$

Still further, on the basis of the embodiment shown in FIG. 13, the foregoing encoding module 113 is further specifically configured to:
obtain the second matrix by using the following formula:

$$G_N = F^{\otimes n}.$$

Still further, on the basis of the embodiment shown in FIG. 13, the foregoing encoding module 113 is further specifically configured to:
obtain the encoded first code word $X_1^N$ by using the following formula:

$$X_1^N = u_B G_N(A) \oplus u_{A^C} G_N(A^C),$$

where
$u_B$ is the second bit vector, $u_{A^C}$ is the frozen bit, A is the information bit index set, $A^C$ is a frozen bit index set, $G_N(A)$ includes a row corresponding to an index of A that is in the second matrix $G_N$, $G_N(A^C)$ includes a row corresponding to an index of $A^C$ that is in $G_N$, and $\oplus$ is a modulo 2 addition operation.

Figure 14:
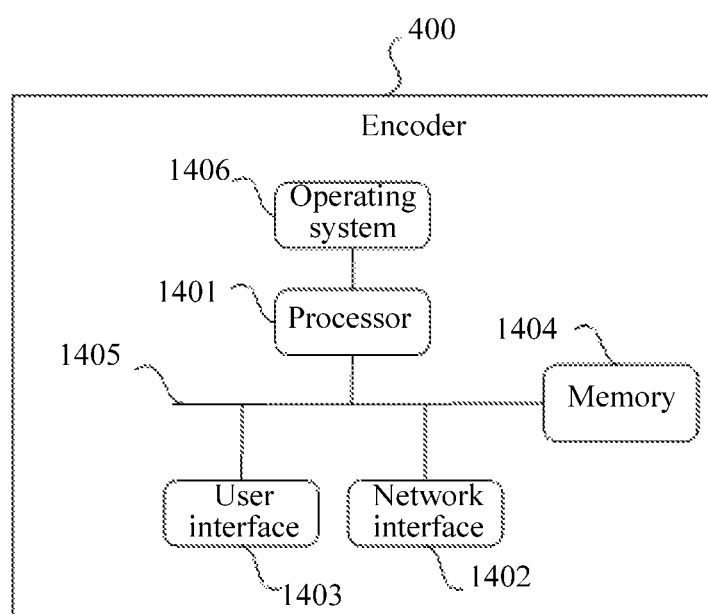
FIG. 14 is a schematic structural diagram of Embodiment 4 of an encoder according to the present invention.

FIG. 14 is a schematic structural diagram of Embodiment 4 of an encoder according to the present invention. As shown in FIG. 14, an encoder 400 of this embodiment includes at least one processor 1401, for example, a central processing unit (Central Processing Unit, CPU for short), at least one network interface 1402 and a user interface 1403, a memory 1404, at least one communications bus 1405, and an operating system 1406. The communications bus 1405 is configured to implement connections and communication between these apparatuses. The memory 1404 may include a high-speed RAM memory, and may further include a non-volatile memory (non-volatile memory), for example, at least one disk memory. The memory 1404 may optionally include at least one storage device far from the foregoing processor 1401. The operating system 1406 includes various programs, and is configured to implement various basic services and process hardware-based tasks.

The processor 1401 is configured to acquire an information bit index set.

The processor 1401 is configured to generate a second bit vector according to a to-be-encoded first information bit and the information bit index set.

The processor 1401 is further configured to perform Polar code encoding on the second bit vector to generate an encoded first code word.

The encoder 400 provided in this embodiment may be configured to execute the corresponding parts that are executed by an encoder and in the technical solutions of the method embodiments shown in FIG. 1 to FIG. 4, and FIG. 10, and implementation principles and technical effects of the encoder 400 are similar and are not described herein again.

FIG. 14 is only a schematic structural diagram of an encoder according to the present invention. The specific structure may be adjusted according to an actual situation.

Figure 15:
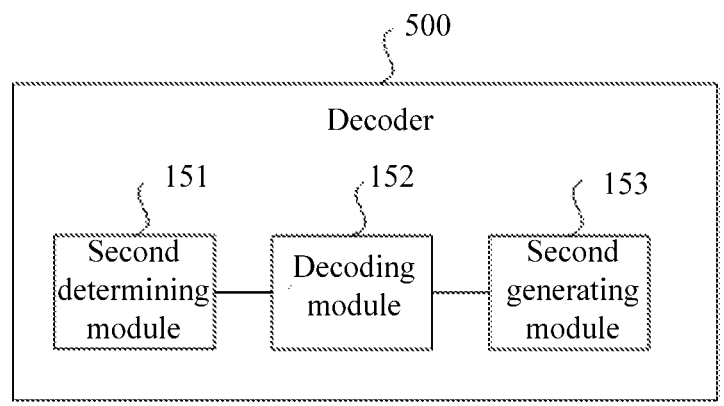
FIG. 15 is a schematic structural diagram of Embodiment 1 of a decoder according to the present invention.

FIG. 15 is a schematic structural diagram of Embodiment 1 of a decoder according to the present invention. As shown in FIG. 15, a decoder 500 of this embodiment includes a second determining module 151, a decoding module 152, and a second generating module 153, where the second determining module 151 is configured to acquire an information bit index set, the decoding module 152 is configured to perform Polar code decoding on a received to-be-decoded vector to generate a third bit vector, and the second generating module 153 is configured to generate a decoded fourth information bit according to the third bit vector and the information bit index set.

Optionally, the second determining module 151 is further configured to: before the generating a decoded fourth information bit according to the third bit vector and the information bit index set, determine the information bit index set according to a Frozen bit index set.

The decoder 500 of this embodiment may be configured to implement the method embodiment shown in FIG. 5 or FIG. 6, and implementation principles and technical effects of the decoder 500 are similar and are not described herein again.

Figure 16:
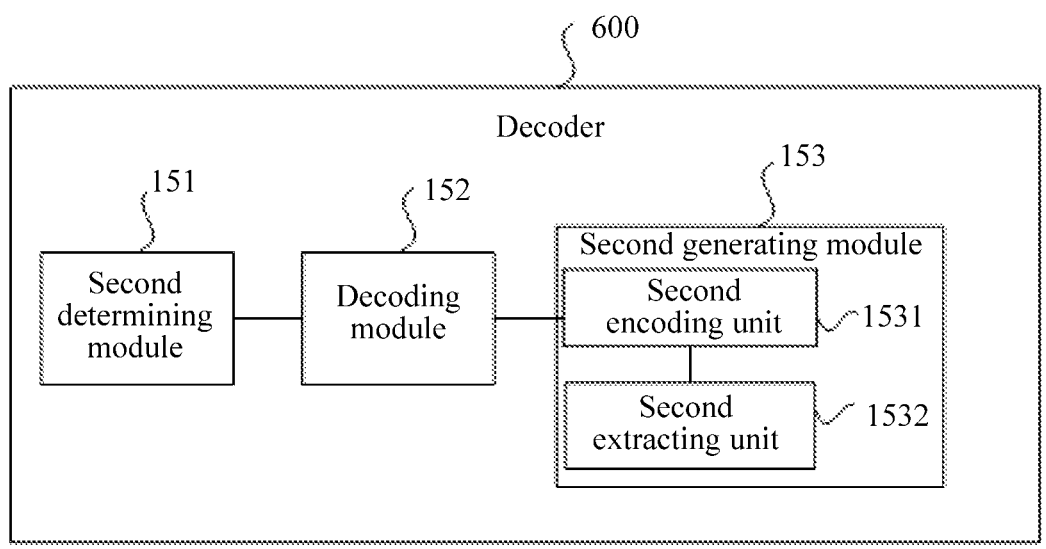
FIG. 16 is a schematic structural diagram of Embodiment 2 of a decoder according to the present invention.

FIG. 16 is a schematic structural diagram of Embodiment 2 of a decoder according to the present invention. As shown in FIG. 16, according to a decoder 600 of this embodiment, on the basis of the embodiment shown in FIG. 15, a second generating module 153 includes a second encoding unit 1531 and a second extracting unit 1532, where the second encoding unit 1531 is configured to perform Polar code encoding on a third bit vector to generate an encoded second code word, and the second extracting unit 1532 is configured to extract, from the encoded second code word, a bit corresponding to a sequence number of an information bit index set and use the bit as a decoded fourth information bit.

The decoder 600 of this embodiment may be configured to implement the method embodiment shown in FIG. 7, and implementation principles and technical effects of the decoder 600 are similar and are not described herein again.

Figure 17:
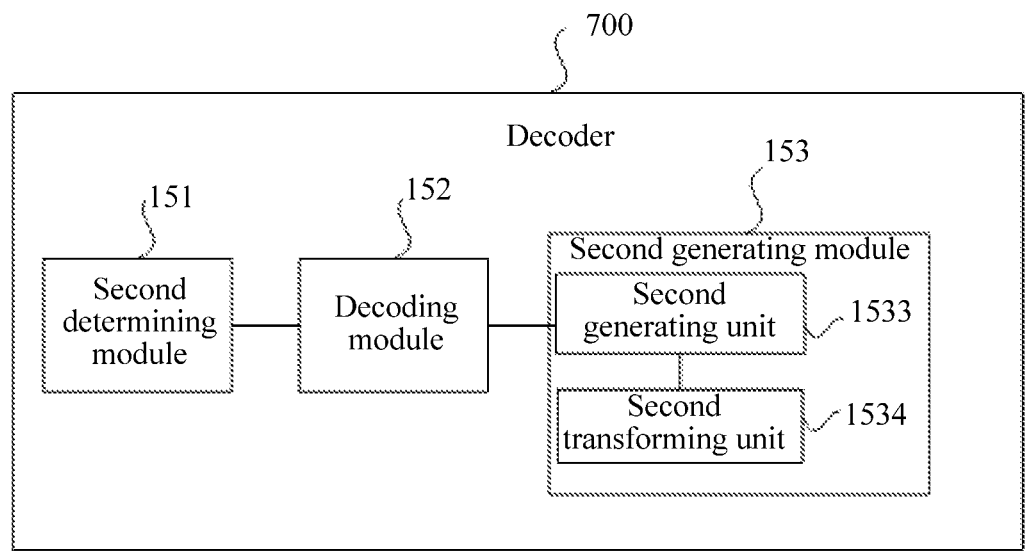
FIG. 17 is a schematic structural diagram of Embodiment 3 of a decoder according to the present invention.

FIG. 17 is a schematic structural diagram of Embodiment 3 of a decoder according to the present invention. As shown in FIG. 17, according to a decoder 700 of this embodiment, on the basis of the embodiment shown in FIG. 15, a second generating module 153 includes a second generating unit 1533 and a second transforming unit 1534, where the second generating unit 1533 is configured to generate a submatrix according to elements that are in a first matrix and respectively corresponding to a row index and a column index of an information bit index set, where the first matrix is $B_N F^{\otimes n} B_N$ or $F^{\otimes n}$, $B_N$ is a transposed matrix, and $F^{\otimes n}$ indicates an $n^{th}$ Kronecker product of F, where F is $$\begin{bmatrix} 1 & 0 \\ 1 & 1 \end{bmatrix};$$

the second transforming unit 1534 is configured to perform, by using the submatrix, linear transformation on a third bit vector to generate a decoded fourth information bit.

The decoder 700 of this embodiment may be configured to implement the method embodiment shown in FIG. 8, and implementation principles and technical effects of the decoder 700 are similar and are not described herein again.

Further, on the basis of the embodiment shown in FIG. 17, the foregoing second transforming unit 1534 may be specifically configured to:

obtain the fourth information bit $\hat{u}_A$ by using the following formula:

$$\hat{u}_A = \hat{u}_B \times G_{AA},$$

where $\hat{u}_B$ is the third bit vector, and $G_{AA}$ is the submatrix.

Figure 18:
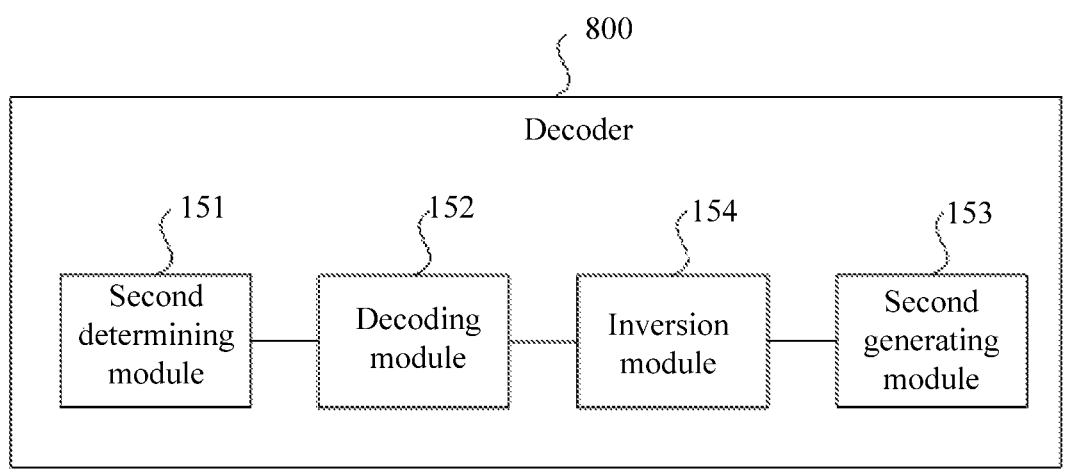
FIG. 18 is a schematic structural diagram of Embodiment 4 of a decoder according to the present invention.

FIG. 18 is a schematic structural diagram of Embodiment 4 of a decoder according to the present invention. As shown in FIG. 18, on the basis of the embodiment shown in FIG. 17, further, a decoder 800 of this embodiment further includes an inversion module 154, where the inversion module 154 is configured to: if a first matrix is $F^{\otimes n}$, perform bit inversion processing on a third bit vector.

Correspondingly, a second transforming unit 1534 is specifically configured to:

perform, according to a submatrix, linear transformation on the third bit vector on which the bit inversion processing has been performed, to generate the decoded fourth information bit.

The decoder 800 of this embodiment may be configured to implement the method embodiment shown in FIG. 9, and implementation principles and technical effects of the decoder 800 are similar and are not described herein again.

Figure 19:
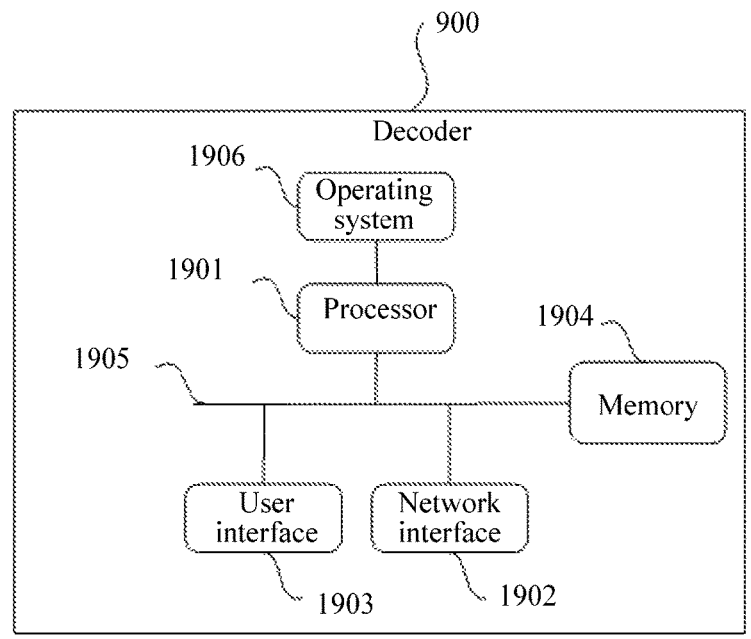
FIG. 19 is a schematic structural diagram of Embodiment 5 of a decoder according to the present invention.

FIG. 19 is a schematic structural diagram of Embodiment 5 of a decoder according to the present invention. As shown in FIG. 19, a decoder 900 of this embodiment includes at least one processor 1901, for example, a CPU, at least one network interface 1902 and a user interface 1903, a memory 1904, at least one communications bus 1905, and an operating system 1906. The communications bus 1905 is configured to implement connections and communication between these apparatuses. The memory 1904 may include a high-speed RAM memory, and may further include a non-volatile memory, for example, at least one disk memory. The memory 1904 may optionally include at least one storage device far from the foregoing processor 1901. The operating system 1906 includes various programs, and is configured to implement various basic services and process hardware-based tasks.

The processor 1901 is configured to acquire an information bit index set.

The processor 1901 is configured to perform Polar code decoding on a received to-be-decoded vector to generate a third bit vector.

The processor 1901 is further configured to generate a decoded fourth information bit according to the third bit vector and the information bit index set.

The decoder 900 provided in this embodiment may be configured to execute the corresponding parts that are executed by a decoder and in the technical solutions of the method embodiments shown in FIG. 5 to FIG. 10, and implementation principles and technical effects of the decoder 900 are similar and are not described herein again.

FIG. 19 is only a schematic structural diagram of a decoder according to the present invention. The specific structure may be adjusted according to an actual situation.

Figure 20:
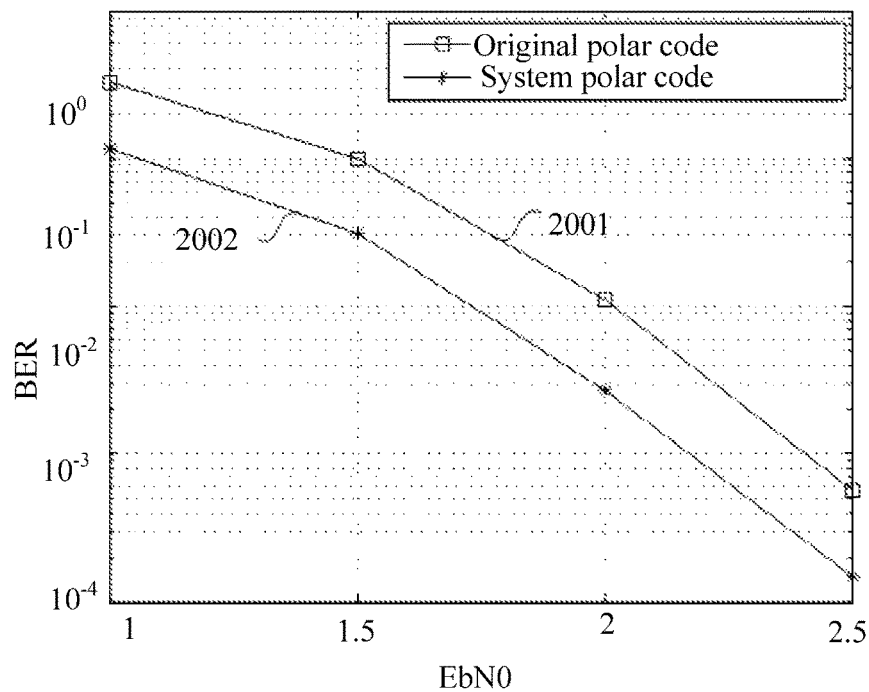
FIG. 20 is schematic diagram of performance comparison between a system polar code and an original polar code in SC decoding according to the present invention.

The following further describes technical effects of the present invention by using a simulation result. FIG. 20 is schematic diagram of performance comparison between a system polar code and an original polar code in SC decoding according to the present invention. As shown in FIG. 20, in the diagram, that a code length is 2048 and a code rate is ½ is used as an example. A curve 2001 is an encoding gain curve obtained by simulating an original Polar code, and a curve 2002 is an encoding gain curve obtained by simulating a system Polar code of the present invention. It can be seen that bit error rate (Bit Error Rate, BER for short) performance of the system Polar code provided in this embodiment of the present invention is better than that of the original Polar code by 0.3 dB.

It may be learned from the foregoing descriptions that, according to the channel encoding and decoding method and apparatus provided in the embodiments of the present invention, linear transformation is first performed, at a transmit end according to a submatrix, on a to-be-encoded first information bit to generate a second bit vector, and Polar code encoding is performed on the second bit vector to generate an encoded first code word; after a to-be-decoded vector is received at a receive end, Polar code decoding is performed on the to-be-decoded vector to generate a third bit vector, and then linear transformation is performed, by using the submatrix, on the third bit vector to generate a decoded fourth information bit, which can implement that a Polar code is converted into a system code in a manner with relatively low complexity, and can improve bit error rate performance of the Polar code.

Persons of ordinary skill in the art may understand that all or a part of the steps of the method embodiments may be implemented by a program instructing relevant hardware. The program may be stored in a computer readable storage medium. When the program runs, the steps of the method embodiments are performed. The foregoing storage medium includes: any medium that can store program code, such as a ROM, a RAM, a magnetic disk, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A channel encoding method for a wireless communication system, comprising:
   inputting, by an encoding device in the wireless communication system, a plurality of to-be-encoded information bits;
   pre-processing, by the encoding device in the wireless communication system, the plurality of to-be-encoded information bits and an information bit index set to generate a bit vector;
   polar code encoding, by the encoding device in the wireless communication system, on the bit vector to output an encoded first code word, wherein the pre-processing, by the encoding device, the plurality of to-be-encoded information bits and the information bit index set to generate the bit vector comprises:
      generating, by the encoding device in the wireless communication system, a submatrix according to elements that are in a first matrix and respectively corresponding to a row index and a column index of the information bit index set, wherein the first matrix is $B_N F^{\otimes n} B_N$ or $F^{\otimes n}$, $B_N$ is a transposed matrix, and $F^{\otimes n}$ indicates an $n^{th}$ Kronecker product of F, wherein F is $$\begin{bmatrix} 1 & 0 \\ 1 & 1 \end{bmatrix};$$

and
   performing, by the encoding device in the wireless communication system and by using the submatrix, linear transformation on the plurality of to-be-encoded information bits to generate the bit vector; and
   transmitting, by a transmitter of the encoding device in the wireless communication system, the encoded first code word to a different device in the wireless communication system.

2. The channel encoding method according to claim 1, wherein the performing, by the encoding device by using the submatrix, linear transformation on the plurality of to-be-encoded information bits to generate the bit vector comprises:
   obtaining, by the encoding device, the bit vector $u_B$ according to:

$$u_B = u_A \cdot G_{AA},$$

wherein
   $u_A$ is the information bit, and $G_{AA}$ is the submatrix.

3. The channel encoding method according to claim 1, wherein the performing, by the encoding device by using the submatrix, linear transformation on the plurality of to-be-encoded information bit to generate the bit vector comprises:
   obtaining, by the encoding device, the bit vector $u_B$ according to:

$$u_B = u_A \times \mathrm{mod}(\mathrm{inv}(G_{AA}), 2),$$

wherein
   $u_A$ is the information bit, $G_{AA}$ is the submatrix $\mathrm{inv}(G_{AA})$ indicates that an inverse operation is performed on $G_{AA}$, and $\mathrm{mod}(\mathrm{inv}(G_{AA}), 2)$ indicates that a modulo 2 operation is performed on $G_{AA}$ on which the inverse operation has been performed.

4. The channel encoding method according to claim 1, wherein the polar code encoding, by the encoding device, on the bit vector to output an encoded first code word comprising:
   generating, by the encoding device, a second matrix according to $F^{\otimes n}$; and
   polar code encoding, by the encoding device by using a frozen bit and the second matrix, on the bit vector to output the encoded first code word.

5. The channel encoding method according to claim 4, wherein the generating, by the encoding device, a second matrix according to $F^{\otimes n}$ comprises:
   obtaining, by the encoding device, the second matrix $G_N$ according to:

$$G_N = B_N F^{\otimes n}.$$

6. The channel encoding method according to claim 4, wherein the generating, by the encoding device, a second matrix according to $F^{\otimes n}$ comprises:
   obtaining, by the encoding device, the second matrix $G_N$ according to:

$$G_N = F^{\otimes n}$$

7. The channel encoding method according to claim 4, wherein the polar code encoding, by the encoding device by using a frozen bit and the second matrix, on the bit vector to obtain the encoded first code word comprises:
   obtaining, by the encoding device, the encoded first code word $X_1^N$ according to:

$$X_1^N = u_B G_N(A) \oplus u_{A^C} G_N(A^C),$$

wherein $u_B$ is the bit vector, $u_{A^c}$ is the frozen bit, A is the information bit index set, $A^C$ is a frozen bit index set, $G_N(A)$ comprises a row corresponding to an index of A that is in the second matrix $G_N$, $G_N(A^C)$ comprises a row corresponding to an index of $A^C$ that is in $G_N$, $\oplus$ and is a modulo 2 addition operation.

8. The channel encoding method according to claim 1, wherein the information bit index set is determined according to a frozen bit index set.

9. A channel encoding method for a wireless communication system, comprising:

inputting, by an encoding device in the wireless communication system, a plurality of to-be-encoded information bits;

pre-processing, by the encoding device in the wireless communication system, the plurality of to-be-encoded information bits and an information bit index set to generate a bit vector;

polar code encoding, by the encoding device in the wireless communication system, on the bit vector to output an encoded first code word, wherein the pre-processing, by the encoding device, the plurality of to-be-encoded information bits and the information bit index set to generate the bit vector comprises:

polar code encoding, by the encoding device in the wireless communication system, on the plurality of to-be-encoded information bits to generate an encoded second code word; and extracting, by the encoding device in the wireless communication system and from the encoded second code word, a plurality of bits each corresponding to a sequence number of the information bit index set, and using the plurality of bits as the bit vector; and transmitting, by a transmitter of the encoding device in the wireless communication system, the encoded first code word to a different device in the wireless communication system.

10. An encoding device for a wireless communication system, comprising:

a memory storage comprising instructions; and one or more processors in communication with the memory storage, wherein the one or more processors execute the instructions to:

input a plurality of to-be-encoded information bits;

pre-process the plurality of to-be-encoded information bits and an information bit index set to generate a bit vector;

polar code encode on the bit vector to generate an encoded first code word, wherein the one or more processors execute the instructions to:

generate a submatrix according to elements that are in a first matrix and respectively corresponding to a row index and a column index of the information bit index set, wherein the first matrix is $B_N F^{\otimes n} B_N$ or $F^{\otimes n}$, $B_N$ is a transposed matrix, and $F^{\otimes n}$ indicates an $n^{th}$ Kronecker product of F, wherein F is $$\begin{bmatrix} 1 & 0 \\ 1 & 1 \end{bmatrix};$$

and perform, by using the submatrix, linear transformation on the plurality of to-be-encoded information bits to generate the bit vector; and transmit the encoded first code word to a different device in the wireless communication system.

11. The encoding device according to claim 10, wherein the one or more processors execute the instructions to:

obtain the bit vector $u_B$ according to:

$$u_B = u_A \times G_{AA},$$

wherein $u_A$ is the information bit, and $G_{AA}$ is the submatrix.

12. The encoding device according to claim 10, wherein the one or more processors execute the instructions to:

obtain the bit vector $u_B$ according to:

$$u_B = u_A \times \mathrm{mod}(\mathrm{inv}(G_{AA}), 2),$$

wherein $u_A$ is the information bit, $G_{AA}$ is the submatrix, $\mathrm{inv}(G_{AA})$ indicates that an inverse operation is performed on $G_{AA}$, and $\mathrm{mod}(\mathrm{inv}(G_{AA}), 2)$ indicates that a modulo 2 operation is performed on $G_{AA}$ on which the inverse operation has been performed.

13. The encoding device according to claim 10, wherein the one or more processors execute the instructions to:

generate a second matrix according to $F^{\otimes n}$; and polar code encode, by using a frozen bit and the second matrix, on the bit vector to output the encoded first code word.

14. The encoding device according to claim 13, wherein the one or more processors execute the instructions to:

obtain the second matrix $G_N$ according to:

$$G_N = B_N F^{\otimes n}.$$

15. The encoding device according to claim 13, wherein the one or more processors execute the instructions to:

obtain the second matrix $G_N$ according to:

$$G_N = F^{\otimes n}.$$

16. The encoding device according to claim 13, wherein the one or more processors execute the instructions to:

obtain the encoded first code word $X_1^N$ according to:

$$X_1^N = u_B G_N(A) \oplus u_{A^c} G_N(A^C),$$

wherein $u_B$ is the bit vector, $u_{A^c}$ is the frozen bit, A is the information bit index set, $A^C$ is a frozen bit index set, $G_N(A)$ comprises a row corresponding to an index of A that is in the second matrix $G_N$, $G_N(A^C)$ comprises a row corresponding to an index of $A^C$ that is in $G_N$, and $\oplus$ is a modulo 2 addition operation.

17. The encoding device according to claim 10, wherein the information bit index set is determined according to a frozen bit index set.

18. An encoding device for a wireless communication system, comprising:

a memory storage comprising instructions; and one or more processors in communication with the memory storage, wherein the one or more processors execute the instructions to:

input a plurality of to-be-encoded information bits;

pre-process the plurality of to-be-encoded information bits and an information bit index set to generate a bit vector;

polar code encode on the bit vector to generate an encoded first code word, wherein the one or more processors execute the instructions to:

polar code encode on the plurality of to-be-encoded information bits to generate an encoded second code word; and extract, from the encoded second code word, a plurality of bits each corresponding to a sequence number of the information bit index set, and use the plurality of bits as the bit vector; and transmit the encoded first code word to a different device in the wireless communication system.

\* \* \* \* \*

UNITED STATES PATENT AND TRADEMARK OFFICE
CERTIFICATE OF CORRECTION

PATENT NO. : 10,341,048 B2
APPLICATION NO. : 14/865811
DATED : July 2, 2019
INVENTOR(S) : Hui Shen and Bin Li It is certified that error appears in the above-identified patent and that said Letters Patent is hereby corrected as shown below:

In the Claims

In Column 22, Line 22, in Claim 2, delete "$u_B=u_A=G_{AA}$," and insert -- $u_B = u_A \times G_{AA}$, --, therefor.

In Column 22, Line 37, in Claim 3, delete "), 2)" and insert -- ),2) --, therefor.

In Column 22, Line 61, in Claim 6, delete "$G_N.=F^{\otimes m}$" and insert -- $G_N.=F^{\otimes n}$. --, therefor.

In Column 23, Line 1, in Claim 7, delete "$X_1^N = u_B G_N.(A) \oplus u_{A^C} G_N.(A^C)$," and insert -- $X_1^N = u_B G_N.(A) \oplus u_{A^C} G_N.(A^C)$, --, therefor In Column 23, Line 7, in Claim 7, delete "$\oplus$ and" and insert -- and $\oplus$ --, therefor.

In Column 24, Line 21, in Claim 12, delete "), 2)" and insert -- ),2) --, therefor.

Signed and Sealed this
Twentieth Day of April, 2021

Drew Hirshfeld
*Performing the Functions and Duties of the*
*Under Secretary of Commerce for Intellectual Property and*
*Director of the United States Patent and Trademark Office*